(12) United States Patent
Yoo et al.

(10) Patent No.: US 7,843,052 B1
(45) Date of Patent: Nov. 30, 2010

(54) SEMICONDUCTOR DEVICES AND FABRICATION METHODS THEREOF

(75) Inventors: Min Yoo, Seoul (KR); Ki Wook Lee, Seoul (KR); Min Jae Lee, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 12/270,690

(22) Filed: Nov. 13, 2008

(51) Int. Cl.
*H01L 23/52* (2006.01)
(52) U.S. Cl. .............................. 257/686; 257/E23.141
(58) Field of Classification Search ................. 257/686, 257/777, E23.141, 678, 734
See application file for complete search history.

(56) References Cited

U.S. PATENT DOCUMENTS

| | | | |
|---|---|---|---|
| 4,394,712 A | 7/1983 | Anthony | |
| 4,499,655 A | 2/1985 | Anthony | |
| 5,229,647 A | 7/1993 | Gnadinger | |
| 6,168,969 B1 | 1/2001 | Farnworth | |
| 6,379,982 B1 | 4/2002 | Ahn et al. | |
| 6,429,509 B1 | 8/2002 | Hsuan | |
| 6,448,661 B1 | 9/2002 | Kim et al. | |
| 6,573,461 B2 | 6/2003 | Roeters et al. | |
| 6,577,013 B1 | 6/2003 | Glenn et al. | |
| 6,608,371 B2 * | 8/2003 | Kurashima et al. | 257/686 |
| 6,780,770 B2 | 8/2004 | Larson | |
| 6,853,572 B1 | 2/2005 | Sabharwal | |
| 6,873,054 B2 | 3/2005 | Miyazawa et al. | |
| 7,151,009 B2 * | 12/2006 | Kim et al. | 438/106 |
| 7,208,838 B2 | 4/2007 | Masuda | |
| 7,223,634 B2 | 5/2007 | Yamaguchi | |
| 2002/0017710 A1 | 2/2002 | Kurashima et al. | |
| 2004/0192033 A1 | 9/2004 | Hara | |
| 2004/0251554 A1 | 12/2004 | Masuda | |
| 2005/0046002 A1 | 3/2005 | Lee et al. | |
| 2005/0104181 A1 * | 5/2005 | Lee et al. | 257/686 |
| 2007/0007639 A1 * | 1/2007 | Fukazawa | 257/686 |

OTHER PUBLICATIONS

Park et al., "Semiconductor Package and Fabricating Method Thereof", U.S. Appl. No. 12/190,039, filed Aug. 12, 2008.

* cited by examiner

*Primary Examiner*—Nathan W Ha
(74) *Attorney, Agent, or Firm*—Gunnison, McKay & Hodgson, L.L.P.; Serge J. Hodgson

(57) ABSTRACT

Semiconductor devices are disclosed. In an embodiment, a plurality of second semiconductor dies formed with through-silicon vias are stacked on a first semiconductor die. The stack of the second semiconductor dies is encapsulated by an encapsulant. Redistribution layers are formed on one surface of the stack and are connected to the through-silicon vias. Solder balls are attached to the respective redistribution layers. In another embodiment, a plurality of second semiconductor dies formed with through-silicon vias are stacked on a first semiconductor die formed with through-silicon vias. Redistribution layers are formed on the back surface of the first semiconductor die. Solder balls are attached to the respective redistribution layers. Further disclosed are methods for fabricating the semiconductor devices.

13 Claims, 10 Drawing Sheets

SEMICONDUCTOR DEVICES AND FABRICATION METHODS THEREOF

BACKGROUND OF THE INVENTION

1. Field of the Invention

The present invention relates to semiconductor devices and methods for fabricating the same.

2. Description of the Related Art

With recent advances in the semiconductor industry and increasing demands of users, electronic devices and semiconductor packages as the most important components thereof have become increasingly small in size and light in weight. Under these circumstances, many types of semiconductor packages have been developed. For example, stacked packages are known in which a vertical stack of a plurality of semiconductor dies is mounted on a substrate to manufacture a single unit semiconductor package. The use of such stacked packages is advantageous in terms of size, weight and mounting area reduction over the use of a plurality of unit semiconductor packages, each including a single semiconductor die.

In a single unit package including a stack of a plurality of semiconductor dies, the semiconductor dies are electrically connected to a substrate by conductive wires. This configuration requires the formation of spacers having a thickness of several hundreds of micrometers to position the conductive wires between the stacked semiconductor dies, resulting in an increase in the overall thickness of the unit package.

Further, the use of the conductive wires for the connection of the semiconductor dies and the substrate or the connection of the respective semiconductor dies via conductive patterns increases the overall length of interconnection lines, inevitably leading to an increase in electrical resistance. Moreover, since the conductive wires are employed as the interconnection lines, the processing speed of the semiconductor dies is reduced, resulting in an increase in power consumption.

BRIEF SUMMARY OF THE INVENTION

Semiconductor devices are disclosed. In an embodiment, a plurality of second semiconductor dies formed with through-silicon vias are stacked on a first semiconductor die. The stack of the second semiconductor dies is encapsulated by an encapsulant. Redistribution layers are formed on one surface of the stack and are connected to the through-silicon vias. Solder balls are attached to the respective redistribution layers. In another embodiment, a plurality of second semiconductor dies formed with through-silicon vias are stacked on a first semiconductor die formed with through-silicon vias. Redistribution layers are formed on the back surface of the first semiconductor die. Solder balls are attached to the respective redistribution layers. Further disclosed are methods for fabricating the semiconductor devices.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION OF THE INVENTION

Figure 1:
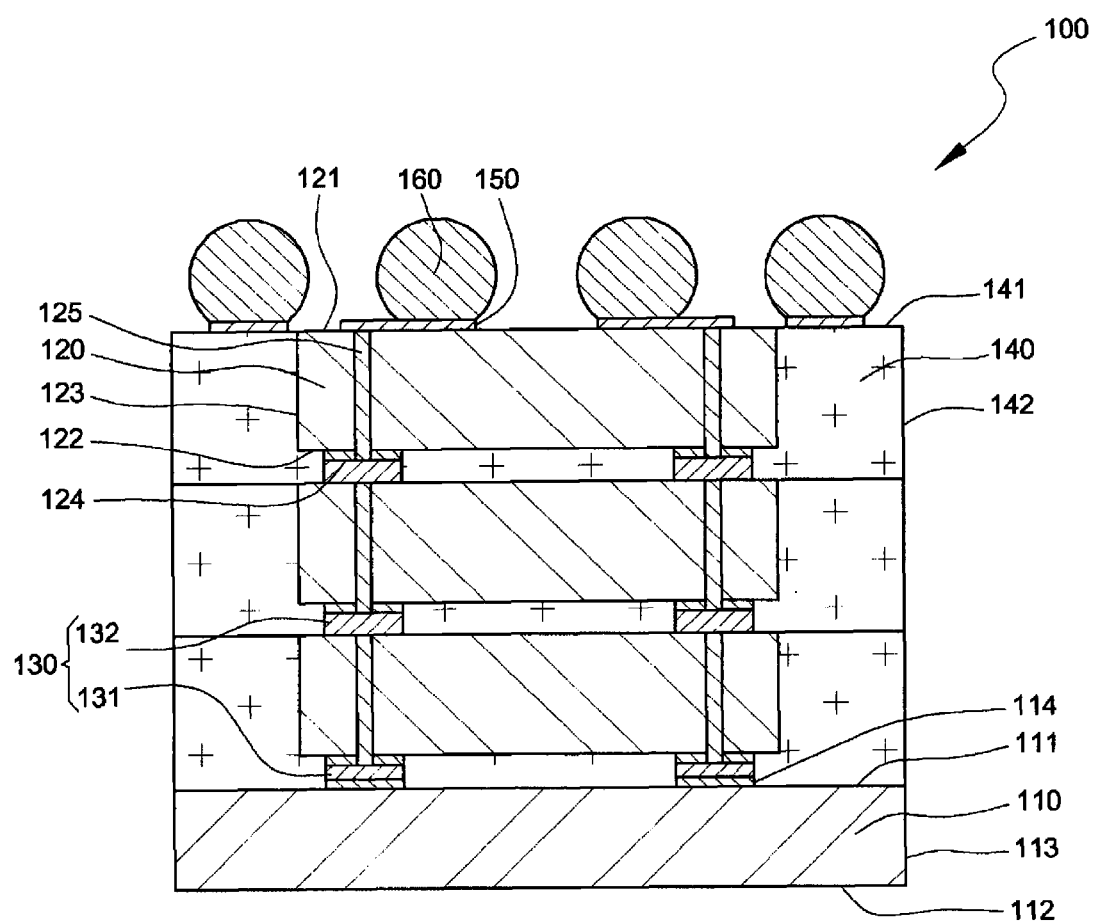
FIG. 1 is a cross-sectional view illustrating a semiconductor device according to an embodiment of the present invention.

Referring to FIG. 1, there is illustrated a cross-sectional view of a semiconductor device 100 according to an embodiment of the present invention.

As illustrated in FIG. 1, the semiconductor device 100 comprises a first semiconductor die 110, a plurality of second semiconductor dies 120 stacked on the first semiconductor die 110, a plurality of conductive connection members 130, an encapsulant 140, a plurality of redistribution layers 150 and a plurality of solder balls 160.

The first semiconductor die 110 has an approximately planar first surface 111, an approximately planar second surface 112 opposed to the first surface 111, and approximately planar third surfaces 113 substantially perpendicular to the first surface 111 and the second surface 112. Further, the first semiconductor die 110 includes a plurality of bond pads 114 formed on the first surface 111 thereof.

The second semiconductor dies 120 are electrically connected to and stacked on the first semiconductor die 110. FIG. 1 shows a stack of three second semiconductor dies 120, but it should be understood that one, two, four or more second semiconductor dies may be stacked on the first semiconductor die 110. That is, no limitation is imposed on the number of the second semiconductor dies 120. Each of the second semiconductor dies 120 has an approximately planar first surface 121, an approximately planar second surface 122 opposed to the first surface 121, and approximately planar third surfaces 123 substantially perpendicular to the first surface 121 and the second surface 122. Further, each of the second semiconductor dies 120 includes a plurality of bond pads 124 formed on the second surface 122. Each of the second semiconductor dies 120 has a smaller width than the first semiconductor die 110. In an alternative embodiment, each of the second semiconductor dies 120 may have a width equal to or larger than the width of the first semiconductor die 110.

Further, each of the second semiconductor dies 120 has through-silicon vias (TSVs) 125, each penetrating the bond pad 124 formed on the second surface 122 and extending to the first surface 121. The through-silicon vias 125 serve to electrically interconnect the plurality of second semiconductor dies 120, thereby eliminating the need for additional conductive wires to electrically interconnect the second semiconductor dies 120. As a result, the intervals and spaces between the adjacent second semiconductor dies 120 can be further narrowed, which contributes to a reduction in the size of the semiconductor device 100 and a further improvement in the electrical performance of the semiconductor device 100. The through-silicon vias 125 are formed by forming through-holes penetrating the second semiconductor dies 120 using a laser and plating the through-holes with a material selected from gold (Au), silver (Ag), copper (Cu), aluminum (Al), nickel (Ni), tungsten (W) and equivalents thereof. There is no restriction on the method and material for the formation of the through-silicon vias 125.

The conductive connection members 130 include first conductive connection members 131 electrically connecting the second semiconductor die 120 to the first semiconductor die 110 and second conductive connection members 132 electrically interconnecting the second semiconductor dies 120.

Specifically, each of the first conductive connection members 131 electrically interconnects the bond pad 114 of the first semiconductor die 110 and the bond pad 124 of the lowest one of the second semiconductor dies 120. Further, each of the conductive connection members 132 electrically interconnects the through-silicon via 125 of the underlying second semiconductor die 120 to the bond pad 124 of the overlying second semiconductor die 120. Examples of suitable materials for the conductive connection members 130 include, but are not limited to, soldering materials, gold (Au), copper (Cu) and equivalents thereof.

The encapsulant 140 encapsulates the first semiconductor die 110, the second semiconductor dies 120 and the conductive connection members 130. In actuality, the encapsulant 140 is formed on the first surface 111 of the first semiconductor die 110 to expose the second surface 112 and the third surfaces 113 of the first semiconductor die 110 to the outside, resulting in a further improvement in the heat dissipation performance of the first semiconductor die 110. The encapsulant 140 surrounds and protects the second semiconductor dies 120 from the ambient environment except that the first surface 121 of the uppermost one of the second semiconductor dies 120 is exposed to the outside. The encapsulant 140 has an upper surface 141 and side surfaces 142. The upper surface 141 of the encapsulant 140 is in the same plane as the first surface 121 of the uppermost one of the second semiconductor dies 120. The side surfaces 142 of the encapsulant 140 are in the same plane as the third surfaces 113 of the first semiconductor die 110. Examples of suitable materials for the encapsulant 140 include, but are not limited to, polyimide (PI), polybenzoxazole (PBO), benzocyclobutene (BCB), epoxy resins, silicone resins, epoxy molding compounds (EMCs) and equivalents thereof.

The redistribution layers (RDL) 150 are electrically connected to the through-silicon vias 125 of the second semiconductor dies 120. Specifically, the redistribution layers 150 are formed on the first surface 121 of the uppermost one of the second semiconductor dies 120 and are electrically connected to the through-silicon vias 125. The redistribution layers 150 can be formed in a fan-in and/or fan-out pattern to ensure a relatively large pitch between the solder balls 160. Specifically, the redistribution layers 150 can be formed at positions closer to the inside and/or outside than the positions of the bond pads 124. The redistribution layers 150 can be formed of a material selected from, but not limited to, gold, copper, aluminum and equivalents thereof.

The solder balls 160 are attached to the respective redistribution layers 150. Of course, the solder balls 160 are regions on which an external device is mounted. Accordingly, the solder balls 160 serve to deliver electrical signals between the semiconductor device 100 and the external device. The solder balls 160 can be made of a material selected from, but not limited to, eutectic solders (e.g., Sn37Pb), high-lead solders (e.g., Sn95Pb) having a high melting point, lead-free solders (e.g., SnAg, SnCu, SnZn, SnZnBi, SnAgCu and SnAgBi) and equivalents thereof.

Figure 2:
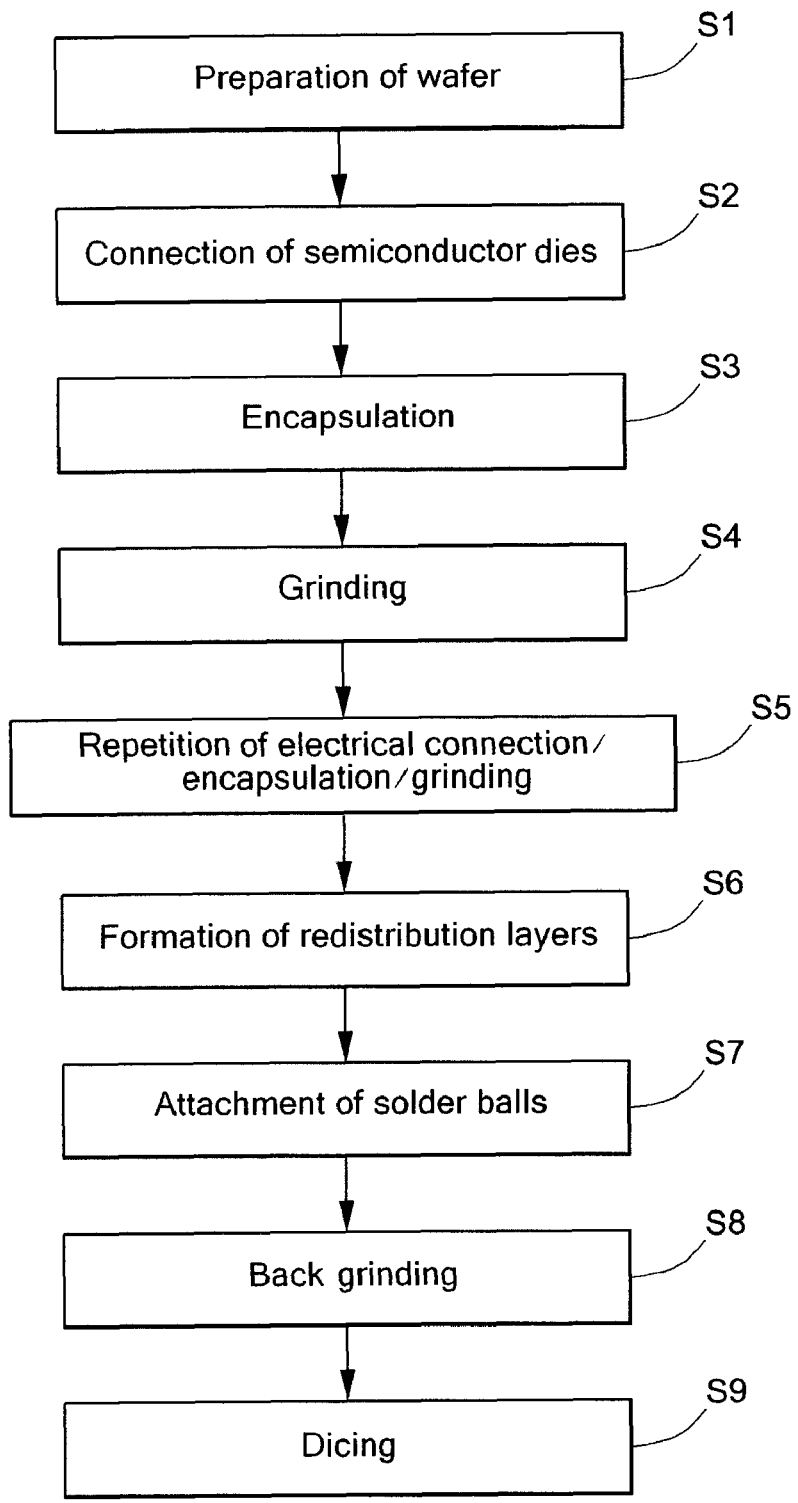
FIG. 2 is a flow chart illustrating a method for fabricating a semiconductor device according to another embodiment of the present invention.

Referring to FIG. 2, there is illustrated a flow chart of a method for fabricating a semiconductor device according to another embodiment of the present invention.

As illustrated in FIG. 2, the method comprises the following operations: preparation of wafer (S1), connection of semiconductor dies (S2), encapsulation (S3), grinding (S4), repetition of electrical connection/encapsulation/grinding (S5), formation of redistribution layers (S6), attachment of solder balls (S7), back grinding (S8), and dicing (S9).

Referring to FIGS. 3A through 3J, there are illustrated cross-sectional views for explaining the method.

Figure 3A:
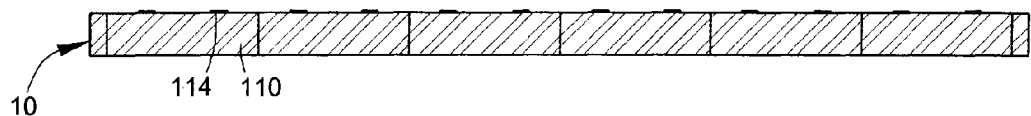
FIGS. 3A through 3J are cross-sectional views illustrating the method of FIG. 2.

In preparation of wafer operation S1, a wafer 10 is prepared in which a plurality of first semiconductor dies 110 are arranged, as illustrated in FIG. 3A. Each of the first semiconductor dies 110 includes a plurality of bond pads 114.

Figure 3B:
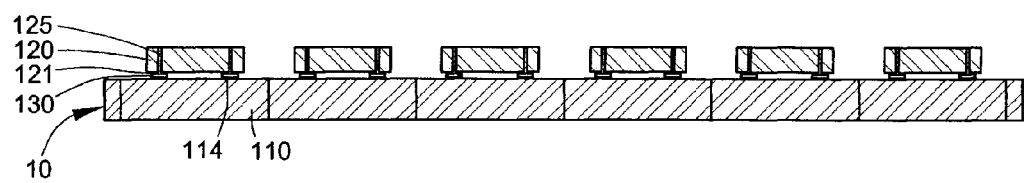

In connection of semiconductor dies operation S2, second semiconductor dies 120 formed with through-silicon vias 125 are electrically connected to the respective first semiconductor dies 110 of the wafer 10, as illustrated in FIG. 3B. For the electrical connection between the first and second semiconductor dies, conductive connection members 130 are interposed between the bond pads 114 of the first semiconductor dies 110 and the bond pads 124 of the second semiconductor dies 120. Examples of suitable materials for the conductive connection members 130 include, but are not limited to, soldering materials, gold (Au), copper (Cu) and equivalents thereof.

Figure 3C:
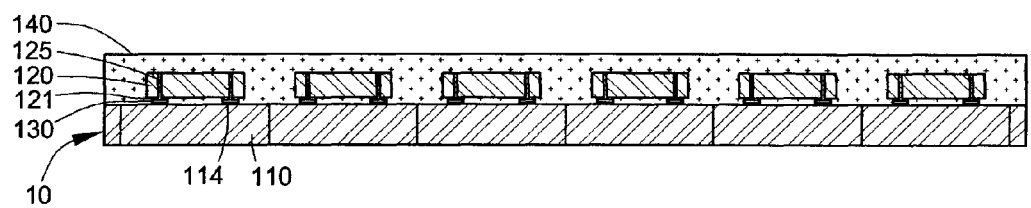

In encapsulation operation S3, the second semiconductor dies 120 are encapsulated by an encapsulant 140, as illustrated in FIG. 3C. In this operation, the encapsulant 140 completely encapsulates the second semiconductor dies 120 on the wafer 10 so as not to be exposed to the outside. The encapsulation can be carried out by a known process selected from spin coating, printing and molding, but is not limited thereto. Examples of suitable materials for the encapsulant 140 include, but are not limited to, polyimide (PI), polybenzoxazole (PBO), benzocyclobutene (BCB), epoxy resins, silicone resins, epoxy molding compounds (EMCs) and equivalents thereof.

Figure 3D:
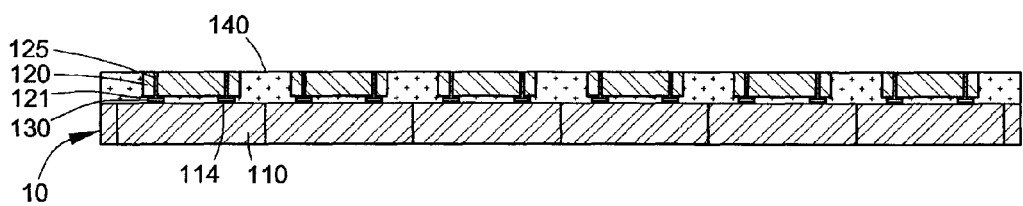

In grinding operation S4, a portion of the encapsulant 140 formed on the second semiconductor dies 120 is ground using a grinding tool (not shown) to allow the upper surfaces of the second semiconductor dies 120 to be exposed to the outside, as illustrated in FIG. 3D. By this grinding, a portion of the encapsulant 140 formed on the second semiconductor dies 120 is removed, and at the same time, the through-silicon vias 125 are exposed to the outside.

Figure 3E:
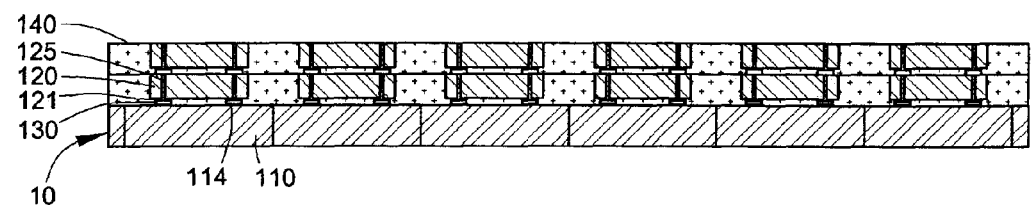
Figure 3F:
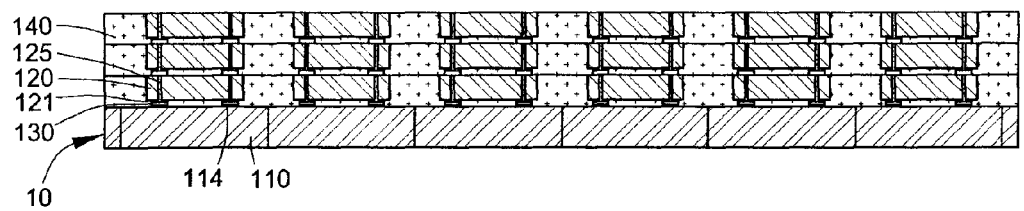

In repetition of electrical connection/encapsulation/grinding operation S5, as illustrated in FIGS. 3E and 3F, additional second semiconductor dies 120 are electrically connected, encapsulated and ground, and this procedure is repeated one or more times to form stacks of the plurality of second semiconductor dies 120. Herein, the electrical connection of the second semiconductor dies 120 is achieved by the use of additional conductive connection members 130. Although FIG. 3F shows three-layer stacks of the second semiconductor dies 120 and the encapsulant 140 on the respective first semiconductor dies 110, it should be understood that one, two, four or more layers of the second semiconductor dies 120 and the encapsulant 140 may be stacked on the respective first semiconductor dies 110.

Figure 3G:
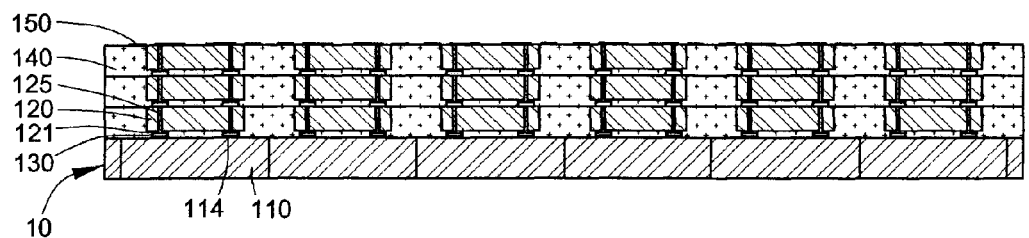

In formation of redistribution layers operation S6, redistribution layers 150 are formed on the uppermost second semiconductor dies 120, as illustrated in FIG. 3G. The redistribution layers 150 are electrically connected to the through-silicon vias 125 of the uppermost second semiconductor dies 120. The redistribution layers 150 can be formed in a fan-in and/or fan-out pattern, but there is no restriction on the pattern of the redistribution layers 150. The redistribution layers 150 can be formed by any suitable process. Examples of such processes include, but are not limited to, physical vapor deposition (PVD), chemical vapor deposition (CVD), evaporation, electroplating, electroless plating, screen printing, sputtering and equivalents thereof. The redistribution layers 150 can be formed of a material selected from gold, copper, aluminum and equivalents thereof. There is no restriction on the method and material for the formation of the redistribution layers 150.

Figure 3H:
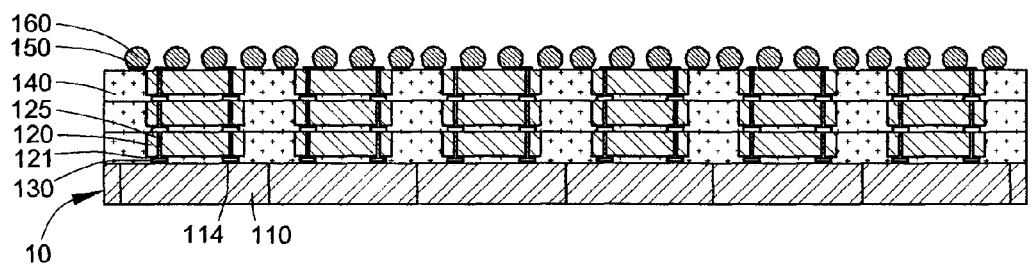

In attachment of solder balls operation S7, solder balls 160 are attached to the respective redistribution layers 150, as illustrated in FIG. 3H. The solder balls 160 can be formed by any process selected from electroplating, ball attachment, stencil printing and equivalents thereof. There is no restriction on the process for the attachment of the solder balls 160.

Figure 3I:
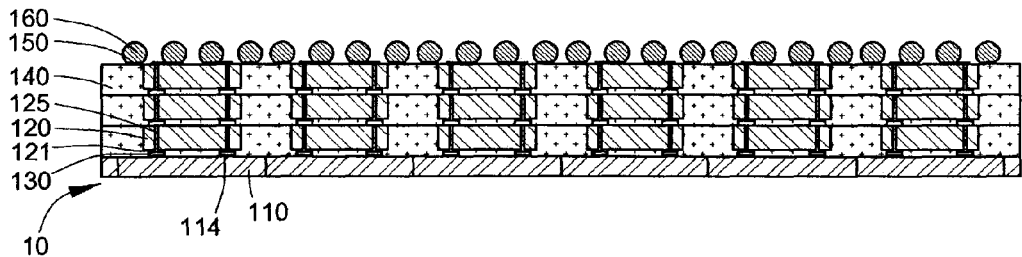

In back grinding operation S8, the back surface of the wafer 10 is ground using a grinding tool (not shown) to remove a predetermined thickness of the wafer 10, as illustrated in FIG. 3I. This back grinding makes the wafer 10 thinner, leading to a reduction in the thickness of the semiconductor device 100.

Figure 3J:
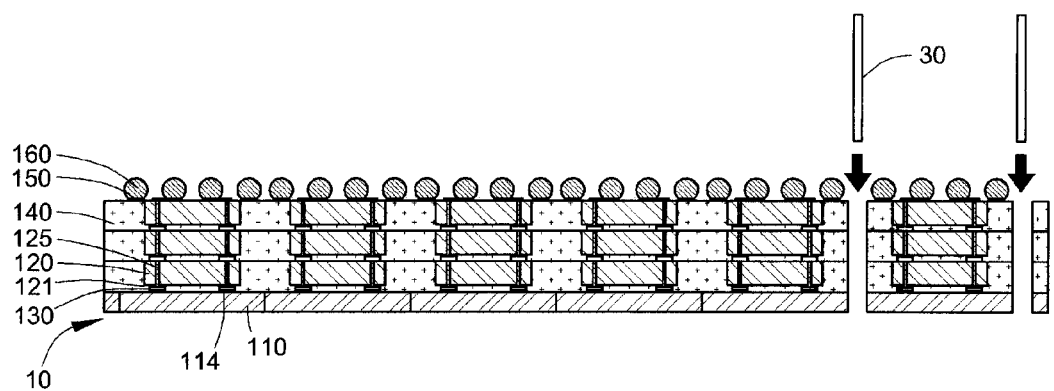

In dicing operation S9, the resulting structure is diced using a dicing tool 30 to separate the first semiconductor dies 110 of the wafer 10 from one another, as illustrated in FIG. 3J. At this time, the encapsulant 140 is also diced to provide a number of semiconductor devices. In each of the semiconductor devices, the side surfaces as well as the back surface of the first semiconductor die 110 are exposed to the outside.

Figure 4:
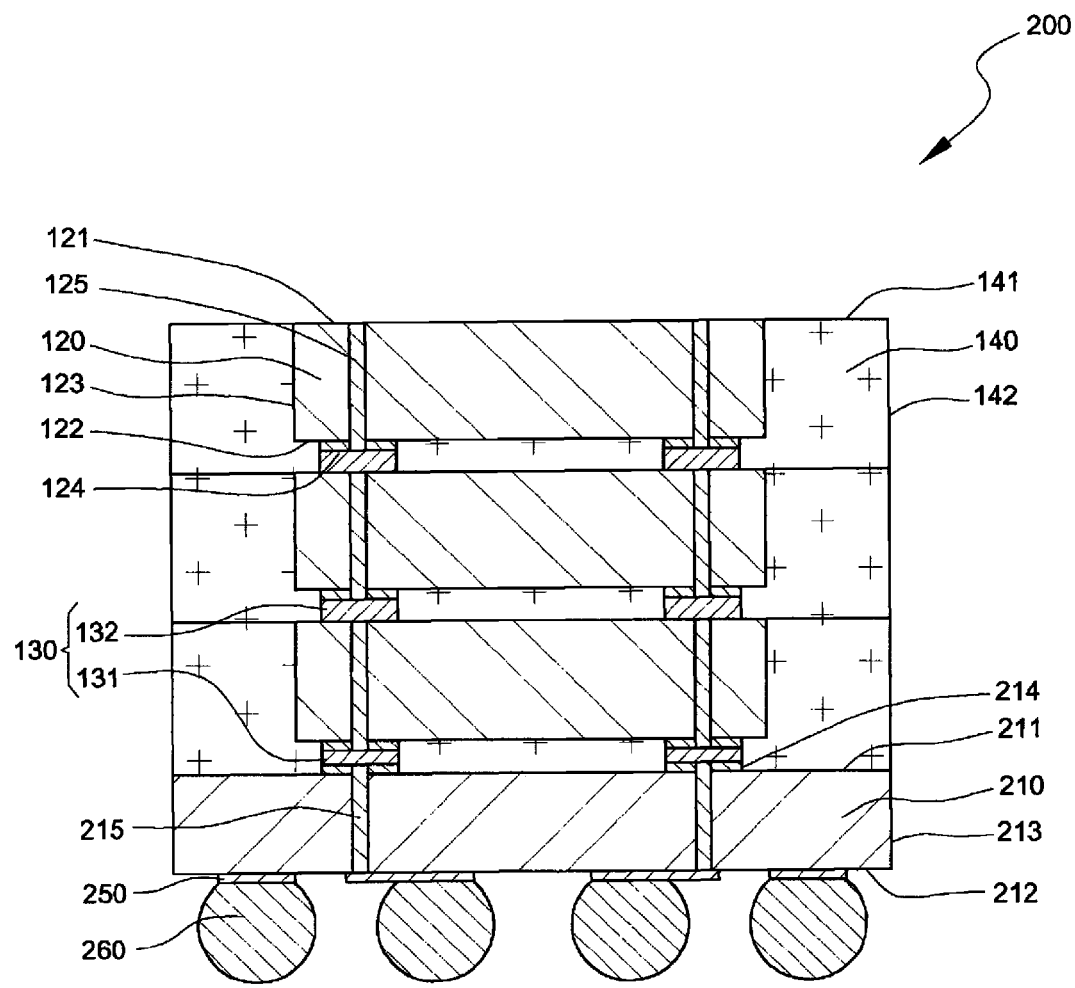
FIG. 4 is a cross-sectional view illustrating a semiconductor device according to another embodiment of the present invention.

Referring to FIG. 4, there is illustrated a cross-sectional view of a semiconductor device 200 according to another embodiment of the present invention.

As illustrated in FIG. 4, the semiconductor device 200 comprises a first semiconductor die 210 formed with through-silicon vias 215, a plurality of second semiconductor dies 120 stacked on the first semiconductor die 210, a plurality of conductive connection members 130, an encapsulant 140, a plurality of redistribution layers 250 and a plurality of solder balls 260.

The first semiconductor die 210 has an approximately planar first surface 211, an approximately planar second surface 212 opposed to the first surface 211, and approximately planar third surfaces 213 substantially perpendicular to the first surface 211 and the second surface 212. Further, the first semiconductor die 210 includes a plurality of bond pads 214 formed on the first surface 211 thereof. Each of the through-silicon vias 215 of the first semiconductor die 210 penetrates the bond pad 214 formed on the first surface 211 and extends to the second surface 212. The through-silicon vias 215 serve to electrically connect the first semiconductor die 210 to an external device (not shown), thereby eliminating the need for additional conductive wires to electrically connect the first semiconductor die 210 to the external device. This contributes to a further reduction in the size of the semiconductor device 200 and a further improvement in the electrical performance of the semiconductor device 200. The through-silicon vias 215 are formed by forming through-holes penetrating the first semiconductor die 210 using a laser and plating the through-holes with a material selected from gold (Au), silver (Ag), copper (Cu), aluminum (Al), nickel (Ni), tungsten (W) and equivalents thereof. There is no restriction on the method and material for the formation of the through-silicon vias 215.

The second semiconductor dies 120, the conductive connection members 130 and the encapsulant 140 are the same as those of the semiconductor device 100, and their explanation is omitted.

The redistribution layers (RDL) 250 are electrically connected to the through-silicon vias 215 of the first semiconductor die 210. Specifically, the redistribution layers 250 are formed on the second surface 212 of the first semiconductor die 210 and are electrically connected to the through-silicon vias 215. The redistribution layers 250 can be formed in a fan-in and/or fan-out pattern to ensure a relatively large pitch between the solder balls 260. Specifically, the redistribution layers 250 can be formed at positions closer to the inside and/or outside than the positions of the bond pads 214.

The solder balls 260 are attached to the respective redistribution layers 250. Of course, the solder balls 260 are regions on which an external device is mounted. Accordingly, the solder balls 260 serve to deliver electrical signals between the semiconductor device 200 and the external device.

Figure 5:
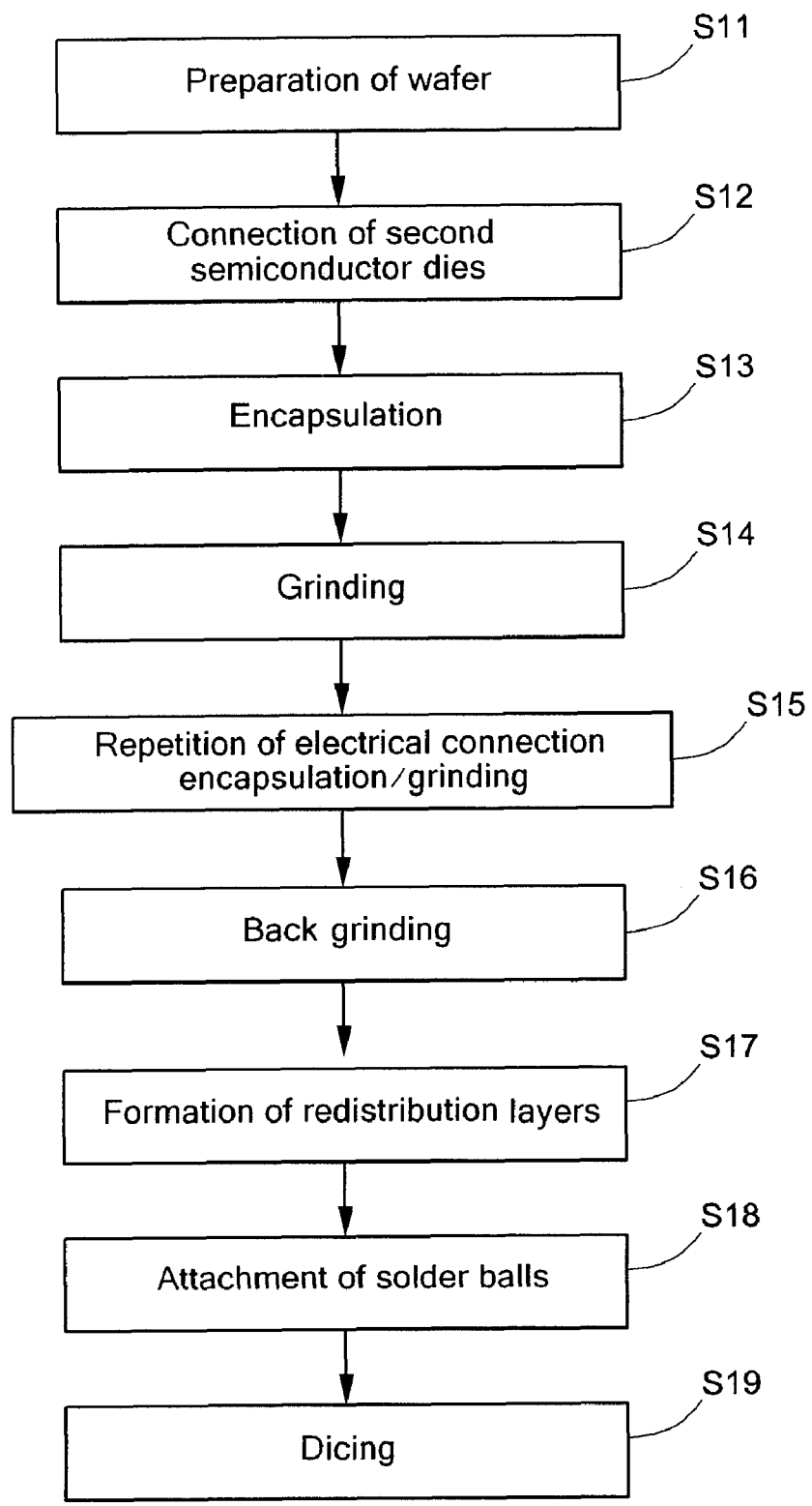
FIG. 5 is a flow chart illustrating a method for fabricating a semiconductor device according to another embodiment of the present invention.

Referring to FIG. 5, there is illustrated a flow chart of a method for fabricating a semiconductor device according to another embodiment of the present invention.

As illustrated in FIG. 5, the method comprises the following operations: preparation of wafer (S11), connection of second semiconductor dies (S12), encapsulation (S13), grinding (S14), repetition of electrical connection/encapsulation/grinding (S15), back grinding (S16), formation of redistribution layers (S17), attachment of solder balls (S18), and dicing (S19).

Referring to FIGS. 6A through 6J, there are illustrated cross-sectional views for explaining the method. Some have already been explained above and description thereof is minimized here.

Figure 6A:
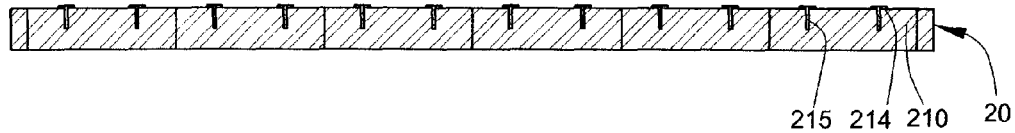
FIGS. 6A through 6J are cross-sectional views illustrating the method of FIG. 5.

In preparation of wafer operation S11, a wafer 20 is prepared in which a plurality of first semiconductor dies 210 are arranged, as illustrated in FIG. 6A. Each of the first semiconductor dies 210 includes a plurality of bond pads 214, and is formed with through-silicon vias 215 penetrating the bond pads 214 and extending to a predetermined depth thereof.

Figure 6B:
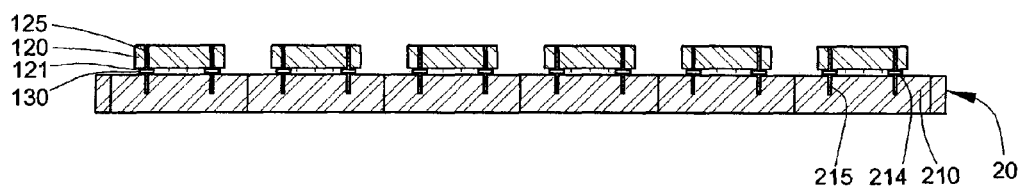

In connection of second semiconductor dies operation S12, second semiconductor dies 120 formed with through-silicon vias 125 are electrically connected to the respective first semiconductor dies 210 of the wafer 20, as illustrated in FIG. 6B. For the electrical connection between the first and second semiconductor dies, conductive connection members 130 are interposed between the bond pads 214 of the first semiconductor dies 210 and the bond pads 124 of the second semiconductor dies 120. By this connection, the through-silicon vias 215 of the first semiconductor dies 210 are electrically interconnected to the through-silicon vias 125 of the second semiconductor dies 120.

Figure 6C:
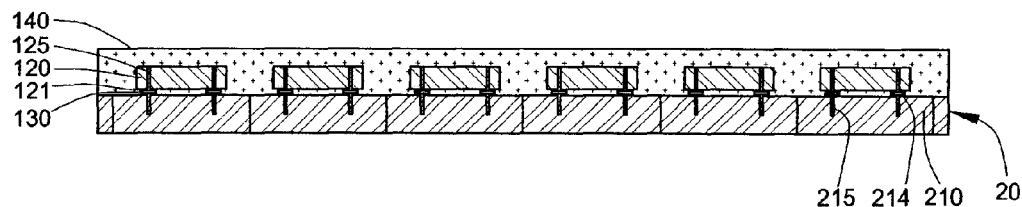

In encapsulation operation S13, the second semiconductor dies 120 are encapsulated by an encapsulant 140, as illustrated in FIG. 6C. In this operation, the encapsulant 140 completely encapsulates the second semiconductor dies 120 on the wafer 20 so as not to be exposed to the outside.

Figure 6D:
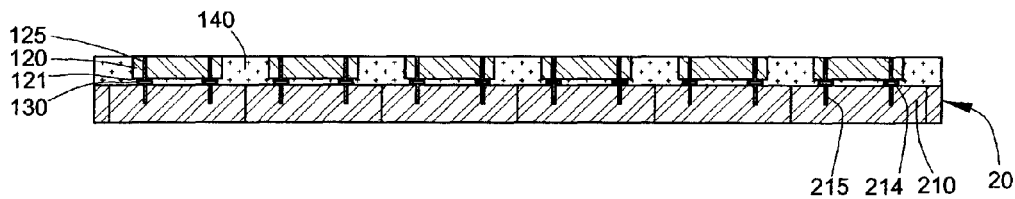

In grinding operation S14, a portion of the encapsulant 140 formed on the second semiconductor dies 120 is ground using a grinding tool to allow the upper surfaces of the second semiconductor dies 120 to be exposed to the outside, as illustrated in FIG. 6D.

Figure 6E:
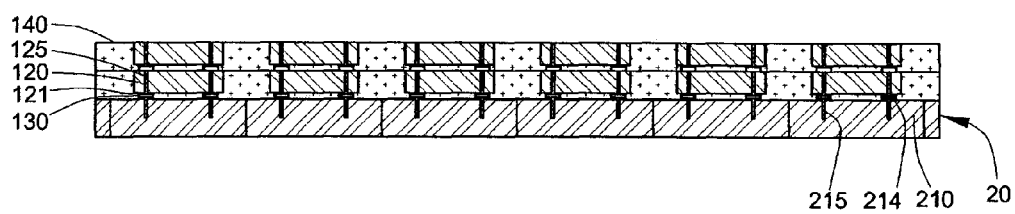
Figure 6F:
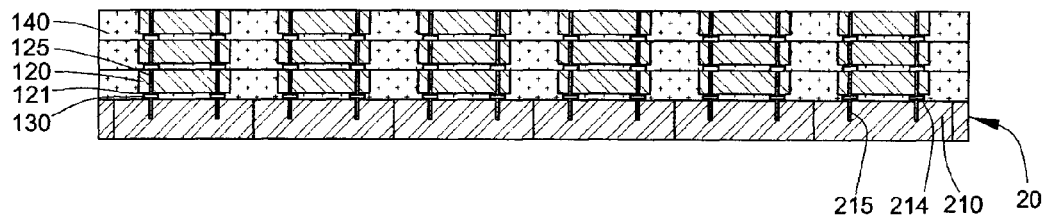

In repetition of electrical connection/encapsulation/grinding operation S15, as illustrated in FIGS. 6E and 6F, additional second semiconductor dies 120 are electrically connected, encapsulated and ground, and this procedure is repeated one or more times to form stacks of the plurality of second semiconductor dies 120. Herein, the electrical connection of the second semiconductor dies 120 is achieved by the use of additional conductive connection members 130. Although FIG. 6F shows three-layer stacks of the second semiconductor dies 120 and the encapsulant 140 on the respective first semiconductor dies 210, it should be understood that one, two, four or more layers of the second semiconductor dies 120 and the encapsulant 140 may be stacked on the respective first semiconductor dies 210.

Figure 6G:
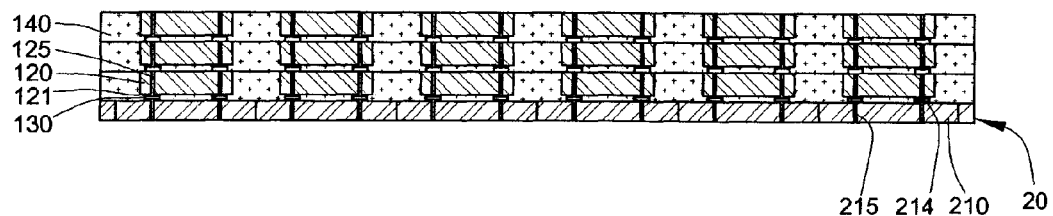

In back grinding operation S16, the back surface of the wafer 20 is ground using a grinding tool to remove a predetermined thickness of the wafer 20, as illustrated in FIG. 6G. Specifically, the wafer 20 is back-ground in such a manner that the through-silicon vias 215 of the wafer 20 are exposed to the outside through the back surface of the wafer 20.

Figure 6H:
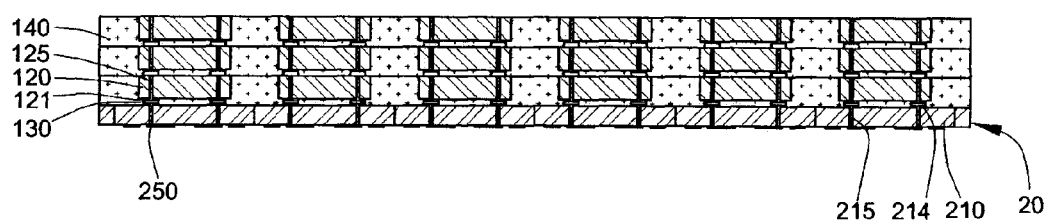

In formation of redistribution layers operation S17, redistribution layers 250 are formed on the back surface of the wafer 20, as illustrated in FIG. 6H. The redistribution layers 250 are electrically connected to the through-silicon vias 215 exposed to the outside through the back surface of the wafer 20. The redistribution layers 250 can be formed in a fan-in and/or fan-out pattern, but there is no restriction on the pattern of the redistribution layers 250.

Figure 6I:
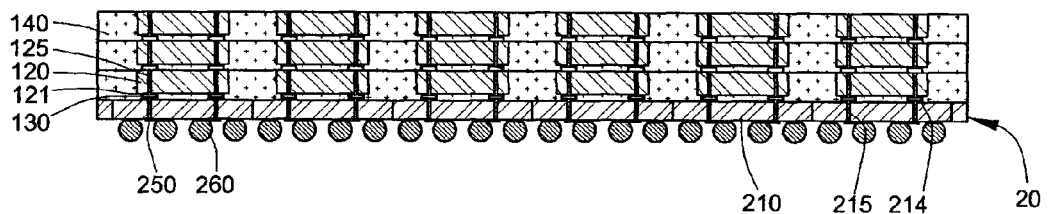

In attachment of solder balls operation S18, solder balls 260 are attached to the respective redistribution layers 250 formed on the back surface of the wafer 20, as illustrated in FIG. 6I.

Figure 6J:
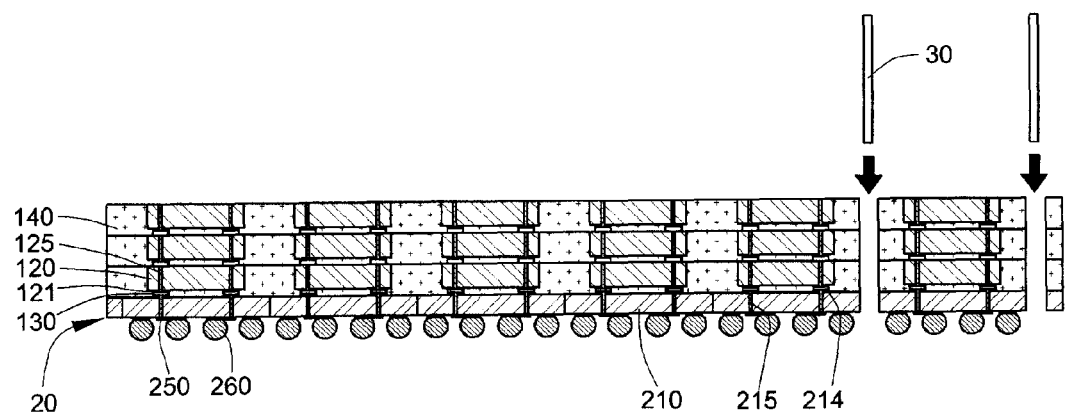

In dicing operation S19, the resulting structure is diced using a dicing tool 30 to separate the first semiconductor dies 210 of the wafer 20 from one another, as illustrated in FIG. 6J. At this time, the encapsulant 140 is also diced to provide a number of semiconductor devices. In each of the semiconductor devices, the side surfaces as well as the back surface of the first semiconductor die 210 are exposed to the outside.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor device comprising:
   a first semiconductor die comprising:
      a first surface;
      a second surface opposed to the first surface;
      third surfaces perpendicular to the first surface and the second surface; and
      bond pads formed on the first surface;
   a stack of second semiconductor dies electrically interconnected to one another by electrically conductive through vias and electrically connected to the bond pads of the first semiconductor die, wherein the first semiconductor die has a larger width than the second semiconductor dies;
   conductive connection members comprising:
      first conductive connection members interposed between and electrically interconnecting the first semiconductor die and the lowest one of the second semiconductor dies; and
      second conductive connection members interposed between and electrically interconnecting the adjacent second semiconductor dies;
   an encapsulant encapsulating the first semiconductor die, the second semiconductor dies and the conductive connection members, wherein the encapsulant covers the first surface, the second surface and the third surfaces being exposed to the outside of the encapsulant, the encapsulant comprising side surfaces in a same plane as the third surfaces;
   redistribution layers electrically connected to the through vias of the second semiconductor dies; and
   solder balls electrically connected to the redistribution layers.

2. The semiconductor device according to claim 1, wherein each of the second semiconductor dies has a first surface and a second surface opposed to the first surface, bond pads are formed on the second surface of the second semiconductor dies, and the through vias penetrate the bond pads of the second semiconductor dies and extend to the first surface of the second semiconductor dies.

3. The semiconductor device according to claim 2, wherein the first surface of the uppermost one of the second semiconductor dies is exposed to the outside of the encapsulant.

4. The semiconductor device according to claim 2, wherein the redistribution layers are formed on the first surface of the uppermost one of the second semiconductor dies.

5. The semiconductor device according to claim 1, wherein the conductive connection members are made of a material selected from the group consisting of soldering materials, gold and copper.

6. The semiconductor device according to claim 1, wherein the encapsulant is a material selected from the group consisting of polyimide (PI), polybenzoxazole (PBO), benzocyclobutene (BCB), epoxy resins, silicone resins and epoxy molding compounds (EMCs).

7. A semiconductor device comprising:
   a first semiconductor die comprising:
      a first surface;
      a second surface opposed to the first surface;
      bond pads formed on the first surface; and
      electrically conductive through vias penetrating the bond pads and extending to the second surface;
   a stack of second semiconductor dies electrically interconnected to one another by electrically conductive through vias and electrically connected to the bond pads of the first semiconductor die, wherein the first semiconductor die has a larger width than the second semiconductor dies;
   conductive connection members comprising:
      first conductive connection members interposed between and electrically interconnecting the first semiconductor die and the lowest one of the second semiconductor dies; and
      second conductive connection members interposed between and electrically interconnecting the adjacent second semiconductor dies;
   an encapsulant encapsulating the first semiconductor die, the second semiconductor dies and the conductive connection members;
   redistribution layers formed on the second surface and electrically connected to the through vias of the first semiconductor die; and
   solder balls electrically connected to the redistribution layers.

8. The semiconductor device according to claim 7, wherein the encapsulant covers the first surface.

9. The semiconductor device according to claim 8, wherein the first semiconductor die has third surfaces perpendicular to the first surface and the second surface, and the second surface and the third surfaces are exposed to the outside of the encapsulant.

10. The semiconductor device according to claim 7, wherein each of the second semiconductor dies has a first surface and a second surface opposed to the first surface, bond pads are formed on the second surface of the second semiconductor dies, and the through vias penetrate the bond pads of the second semiconductor dies and extend to the first surface of the second semiconductor dies.

11. The semiconductor device according to claim 10, wherein the first surface of the uppermost one of the second semiconductor dies is exposed to the outside of the encapsulant.

12. The semiconductor device according to claim 7, wherein the conductive connection members are made of a material selected from the group consisting of soldering materials, gold and copper.

13. The semiconductor device according to claim 7, wherein the encapsulant is a material selected from the group consisting of polyimide (PI), polybenzoxazole (PBO), benzocyclobutene (BCB), epoxy resins, silicone resins and epoxy molding compounds (EMCs).

* * * * *